United States Patent
Hajimiri et al.

(10) Patent No.: US 6,888,396 B2
(45) Date of Patent: May 3, 2005

(54) MULTI-CASCODE TRANSISTORS

(76) Inventors: Seyed-Ali Hajimiri, 425 San Palo Pl., Pasadena, CA (US) 91107; Scott D. Kee, 2480 Irvine Blvd., Apt. 301, Tustin, CA (US) 92782; Ichiri Aoki, 52 W. Pamela Rd., Arcadia, CA (US) 91007

( * ) Notice: Subject to any disclaimer, the term of this patent is extended or adjusted under 35 U.S.C. 154(b) by 0 days.

(21) Appl. No.: 10/385,769

(22) Filed: Mar. 11, 2003

(65) Prior Publication Data
US 2004/0027755 A1 Feb. 12, 2004

Related U.S. Application Data

(60) Provisional application No. 60/363,483, filed on Mar. 11, 2002.

(51) Int. Cl.[7] .............................................. H03K 17/687
(52) U.S. Cl. ...................... 327/427; 327/436; 327/581
(58) Field of Search ................................ 327/427, 436, 327/581

(56) References Cited

U.S. PATENT DOCUMENTS

| | | | | |
|---|---|---|---|---|
| 3,007,061 A | * | 10/1961 | Gindi | 327/482 |
| 3,496,385 A | | 2/1970 | Hopkins | 307/254 |
| 4,317,055 A | * | 2/1982 | Yoshida et al. | 327/541 |
| 4,394,590 A | * | 7/1983 | Honda | 327/436 |
| 4,692,643 A | * | 9/1987 | Tokunaga et al. | 327/436 |
| 4,751,408 A | * | 6/1988 | Rambert | 327/436 |
| 5,838,199 A | * | 11/1998 | Nakamura | 330/258 |
| 6,320,414 B1 | * | 11/2001 | Annema et al. | 326/80 |
| 6,476,675 B1 | * | 11/2002 | Sun | 330/253 |

FOREIGN PATENT DOCUMENTS

| | | | | |
|---|---|---|---|---|
| EP | 0 048 885 A | | 4/1982 | H03F/3/193 |

OTHER PUBLICATIONS

Search Report for PCT/US03/07158 Dated Jul. 7, 2003 in co-pending PCT filing of U.S. application filed herewith.
U. Tietz, CH. Schenk: "Halbleiterschaltungstechnik 8. Auflage" 1986, Springer Verlag Berlin, Berlin Heidelberg New York, XP002245314, p. 476–p. 478, Figure 16.6.

* cited by examiner

*Primary Examiner*—Quan Tra
(74) *Attorney, Agent, or Firm*—Godwin Gruber, LLP; Christopher Rourk

(57) ABSTRACT

A cascode circuit with improved withstand voltage is provided. The cascode circuit includes three or more transistors, such as MOSFET transistors. Each transistor has a control terminal, such as a gate, and two conduction terminals, such as a drain and a source. The conduction terminals are coupled in series between two output terminals, such as where the drain of each transistor is coupled to the source of another transistor. A signal input is provided to the gate for the first transistor. Two or more control voltage sources, such as DC bias voltages, are provided to the gate of the remaining transistors. The DC bias voltages are selected so as to maintain the voltage across each transistor to a level below a breakdown voltage level.

18 Claims, 8 Drawing Sheets

MULTI-CASCODE TRANSISTORS

CROSS-REFERENCE TO RELATED APPLICATIONS

This application claims priority to provisional U.S. patent application Ser. No. 60/363,483, filed Mar. 11, 2002, which is expressly incorporated by reference for all purposes.

FIELD OF THE INVENTION

The present invention pertains to the field of cascode transistor architectures. More specifically, the invention relates to multi-cascode transistors that provide optimized breakdown voltage for power transistors.

BACKGROUND OF THE INVENTION

The low breakdown voltage of transistors is problematic for power applications. High frequency transistors such as but not limited to submicron CMOS transistors, silicon on insulator (CMOS-SOI) transistors, silicon (Si) transistors, silicon germanium (SiGe) transistors, and SiGe heterojunction bipolar transistors (HBT) support maximum voltages ranging from ten volts to four volts or even lower between the drain to source, drain to gate, collector to emitter, or collector to base. Nevertheless, certain applications demand the use of a high voltage supply resulting in operating conditions above what these devices can support. Applications requiring a high power output to a high impedance load and other applications cannot be implemented if low breakdown voltage transistors are used in a conventional way.

Cascode topology is one way to increase the operating voltage for transistors. A conventional cascode topology can include, for example, two transistors connected in series with the source of a first MOSFET transistor connected to the drain of a second MOSFET transistor, or the emitter of a first bipolar junction transistor (BJT) coupled to the collector of a second bipolar junction transistor.

A conventional cascode arrangement with two transistors connected in series presents several limitations. First, the maximum voltage allowable between the collector to emitter or the drain to source is limited to twice the voltage that an individual transistor can support. Higher voltage cannot be applied without risking voltage breakdown.

Second, if the gate or base voltage of the second transistor is held constant, a DC voltage between the collector and the base or the base and the emitter of a BJT, or between the drain and the gate or the gate and the source of a FET transistor, can cause a voltage breakdown.

Furthermore, in applications using integrated circuits, a large bypass capacitor is required to keep the voltage at the gates or bases constant. This capacitor will occupy an undesired large area increasing the cost of the integrated circuit and making the layout of the circuit more difficult.

These limitations restrict the use of conventional cascode topologies to the applications that require an output voltage lower than twice the breakdown voltage of the individual transistor.

SUMMARY OF THE INVENTION

In accordance with the present invention, a multiple transistor cascode circuit is provided that overcomes known problems with existing cascode circuits.

In particular, a multiple transistor cascode circuit is provided that allows higher voltages to be processed by the cascode circuit.

In accordance with an exemplary embodiment of the present invention, a cascode circuit with improved withstand voltage is provided. The cascode circuit includes three or more transistors, such as but not limited to MOSFET transistors. Each transistor has a control terminal, such as a gate, and two conduction terminals, such as a drain and a source. The conduction terminals are coupled in series between two output terminals, such as where the drain of each transistor is coupled to the source of another transistor. A signal input is provided to the gate for the first transistor. Two or more control voltage sources, such as DC bias voltages, are provided to the gates of the remaining transistors. The voltages are selected so as to maintain the voltage across each transistor to a level below a breakdown voltage level.

The present invention provides many important technical advantages. One important technical advantage of the present invention is a cascode circuit that allows three or more transistors to be used, such that maximum voltages in excess of two times a single transistor withstanding voltage can be processed. The present invention thus allows high frequency transistors to be used in applications where the maximum voltage is greater than two times the breakdown voltage of a transistor.

Those skilled in the art will appreciate the advantages and superior features of the invention together with other important aspects thereof on reading the detailed description that follows in conjunction with the drawings.

DETAILED DESCRIPTION OF THE INVENTION

Figure 1A:
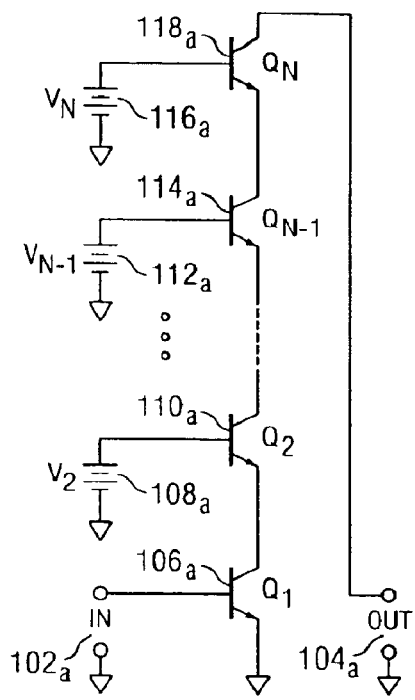
FIGS. 1a and 1B are diagrams of cascode circuits for providing a cascode topology using three or more transistors in accordance with an exemplary embodiment of the present invention.

In the description that follows like parts are marked throughout the specification and drawings with the same reference numerals, respectively. The drawing figures are not necessarily to scale and certain features may be shown in somewhat generalized or schematic form in the interest of clarity and conciseness.

Figure 1B:
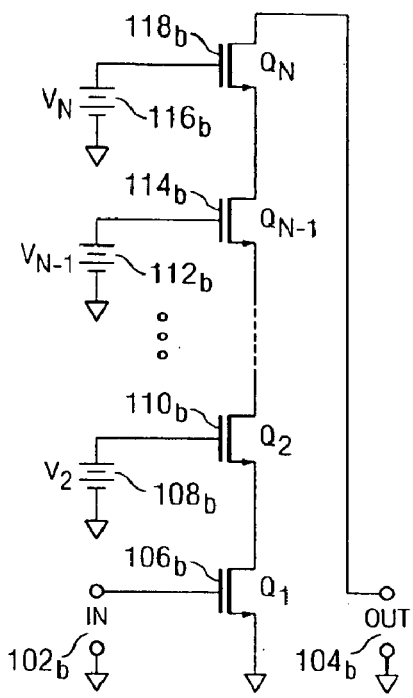

FIGS. 1a and 1B are diagrams of cascode circuits 100a and 100b for providing a cascode topology using three or more transistors in accordance with an exemplary embodiment of the present invention. Cascode circuits 100a and 100b allow the peak voltage applied between the drain or collector of a top-most transistor and the source or emitter of the bottom-most transistor to be divided amongst all transistors, so as to prevent voltage breakdown of one or more transistor.

Cascode circuit 100a includes input 102a and output 104a, and cascode circuit 100b includes input 102b and output 104b. For cascode circuit 100a, BJT transistor 106a functions as $Q_1$, the signal processing transistor. Additional transistors are connected in series as 110a, which corresponds to $Q_2$, 114a, which corresponds to $Q_{N-1}$, and 118a which corresponds to $Q_N$. One of ordinary skill in the art will recognize that a suitable number of transistors can be connected in series in this manner so as to provide a desired level of peak withstand voltage capability. In the MOSFET implementation of cascode circuit 100b, transistor 106b is coupled to transistor 110b, 114b, and 118b, all in series with the source of the top transistor coupled to the drain of the bottom transistor.

Cascode circuit 100a includes voltage sources 108a, 112a, and 116a, and corresponding cascode circuit 100b includes voltage sources 108b, 112b, and 116b. These voltage sources correspond to each series transistor, such that the base or gate voltage is maintained so as to prevent the base to collector or gate to drain voltage across each transistor from exceeding that of the breakdown voltage of any transistor in the cascode array.

Figure 2:
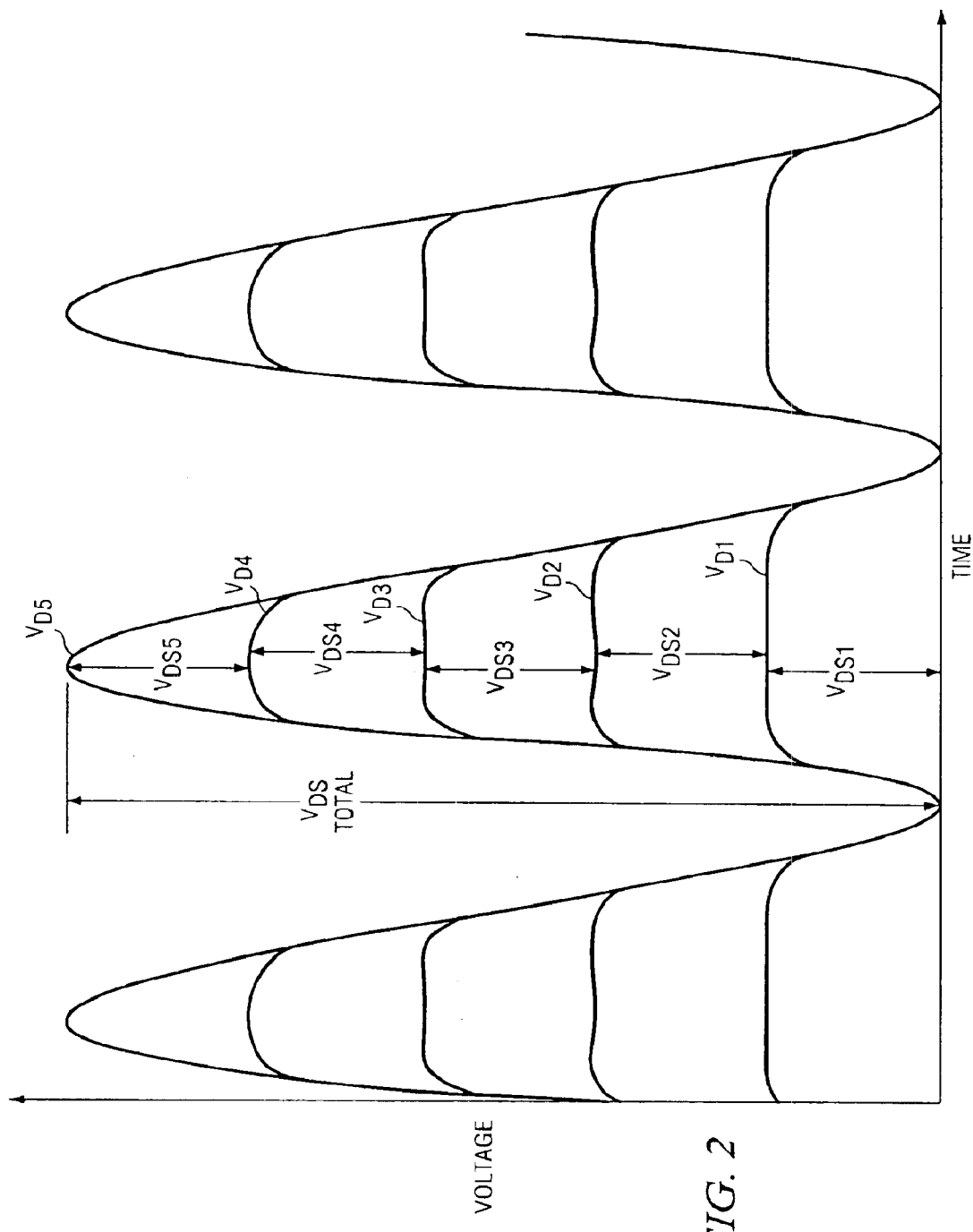
FIG. 2 is a graph showing an example of total $V_{DS}$ varying as a function of time from zero to a peak value that consists of five components, namely, $V_{DS1}$ through $V_{DS5}$.

Using this technique, the transistors are connected in series as in a conventional cascode, i.e., each transistor drain or collector is connected to the source or emitter of the next transistor. The input signal is applied to the gate or base of the first transistor $Q_1$. All the gates or bases of the other transistors are kept at different constant DC voltages. These DC voltages are selected to keep the peak voltage between the drain or collector of the $Q_N$ transistor and the source or emitter of the $Q_1$ transistor divided between the N transistors as can be seen in FIGS. 1a and 1b, where the total drain to source voltage $V_{DS}$ is evenly divided among voltages $V_{DS1}$, $V_{DS2}$, $V_{DS3}$, $V_{DS4}$, and $V_{DS5}$. This is shown graphically in FIG. 2 where the total $V_{DS}$ varies as a function of time from zero to a peak value that consists of five components, namely, $V_{DS1}$ through $V_{DS5}$. In this manner, the peak voltage applied between the drain or collector for transistor $Q_N$ and the source or emitter for transistor $Q_1$ can be evenly divided among N transistors thus avoiding the drain to source or collector to emitter breakdown of the circuit with the supply voltage of up to N times larger than the drain to source or collector to emitter breakdown voltage of an individual transistor.

Figure 3A:
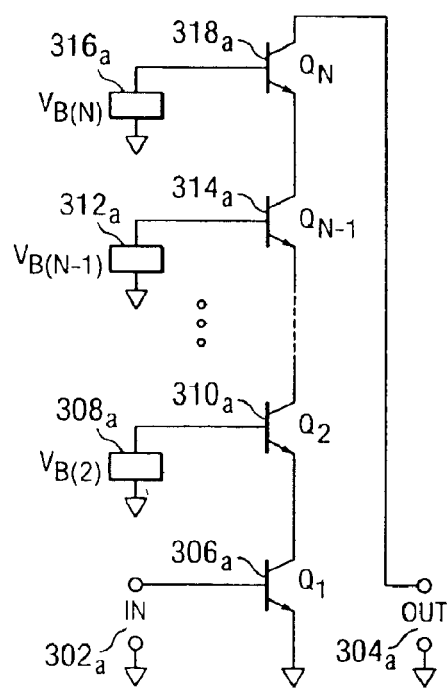
FIGS. 3a and 3b show cascode circuits with nonlinear gate or base voltages, in accordance with an exemplary embodiment of the present invention.
Figure 3B:
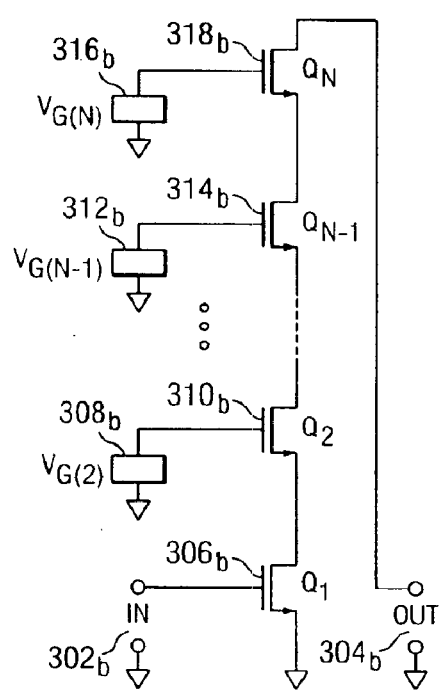

FIGS. 3a and 3b show cascode circuits 300a and 300b, respectively, with non-constant gate or base voltages in accordance with an exemplary embodiment of the present invention. Cascode circuits 300a and 300b allow base-emitter or gate-source and collector-base or gate-drain breakdown voltage to be avoided using three or more transistors in a multi-cascode topology.

FIG. 3a shows a BJT implementation of a cascode circuit 300a having input 302a, output 304a, and transistors 306a, 310a, 314a, and 318a, which correspond to transistors $Q_1$, $Q_2$, $Q_{N-1}$, and $Q_N$. Likewise, base voltage sources 308a, 312a, and 316a corresponding to $V_{B(2)}$, $V_{B(N-1)}$, and $V_{B(N)}$ are used to drive the base voltage for each corresponding transistor. A linear or nonlinear circuit is used to drive the base voltage of each transistor to keep the voltage across the drain-gate or collector-base and gate-source or base-emitter below the respective breakdown voltage. Likewise, FIG. 3b shows a MOSFET implementation of a cascode circuit 300b with inputs 302b, output 304b, and signal transistor 306b. Cascode transistors 310b, 314b, and 318b correspond to transistors $Q_2$, $Q_{N-1}$, and $Q_N$. Likewise, gate voltage supply $V_{G(2)}$, $V_{G(N-1)}$, and $V_{G(N)}$ correspond to sources 308b, 312b, and 316b.

Figure 4:
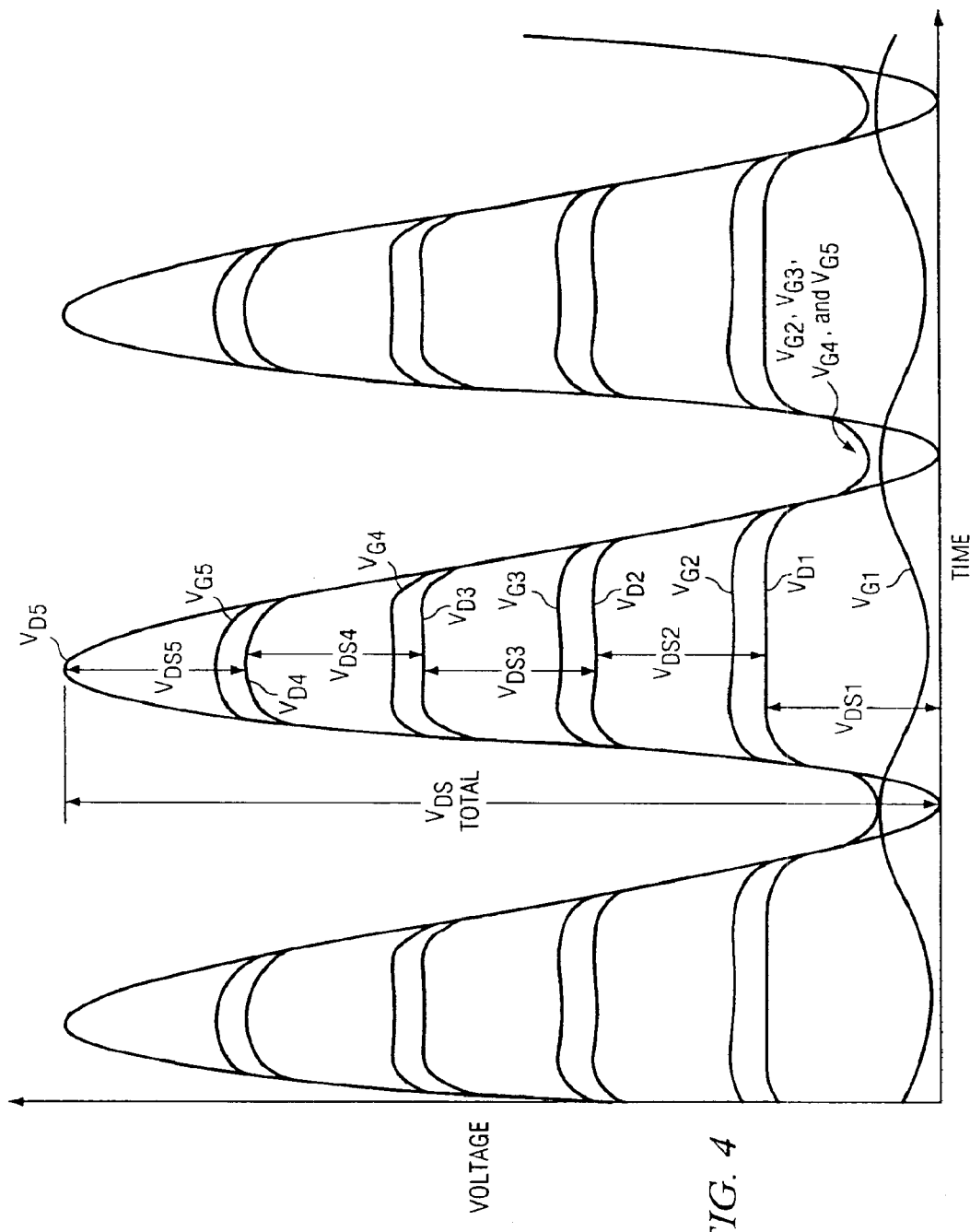
FIG. 4 shows an exemplary voltage waveform $V_{G1}$ as applied to an input of cascode transistors.

FIG. 4 shows an exemplary input voltage waveform $V_{G1}$ as applied to input 302b of cascode circuit 300b implemented with five transistors, wherein $V_{G1}$ varies over time as shown resulting in a total drain-source voltage across cascode circuit 300b as shown, with corresponding drain, gate, and source voltages for each of the five transistors. A similar relationship for collector, base, and emitter voltages would apply for cascode circuit 300a implemented with five transistors. For example, as $V_{G1}$ increases, the current through the cascode circuit increases and the corresponding voltage drop across each transistor decreases. Likewise, as $V_{G1}$ decreases, the current through the cascode circuit decreases, and total $V_{DS}$ is imposed across each transistor of the cascode circuit. Using cascode circuit 300b, the absolute magnitude of $V_{DS1}$, $V_{DS2}$, $V_{DS3}$, $V_{DS4}$, and $V_{DS5}$ relative to common increases as shown, but the relative magnitudes of each are approximately equal. Likewise, the absolute magnitude of $V_{G2}$, $V_{G3}$, $V_{G4}$ and $V_{G5}$ each increase as shown, but the relative magnitude of the gate voltages to $V_{D1}$, $V_{D2}$, $V_{D3}$ and $V_{D4}$, respectively, are approximately equal as shown. In this manner, the base-emitter or gate-source and collector-base or drain-gate voltages are controlled by $V_{G(2)}$ through $V_{G(N)}$ to avoid voltages that would exceed the breakdown voltages, even when the voltage at any given drain, source, collector, or emitter relative to common would exceed the breakdown voltage.

Figure 5A:
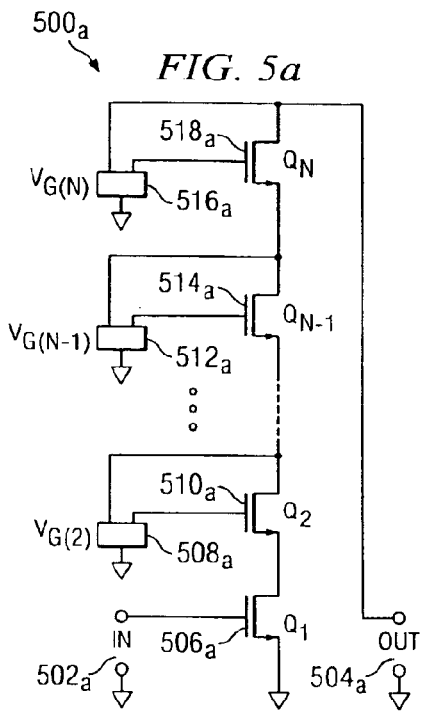
FIGS. 5a and 5b show cascode circuits with drain or source controlled gate voltages in accordance with an exemplary embodiment of the present invention.
Figure 5B:
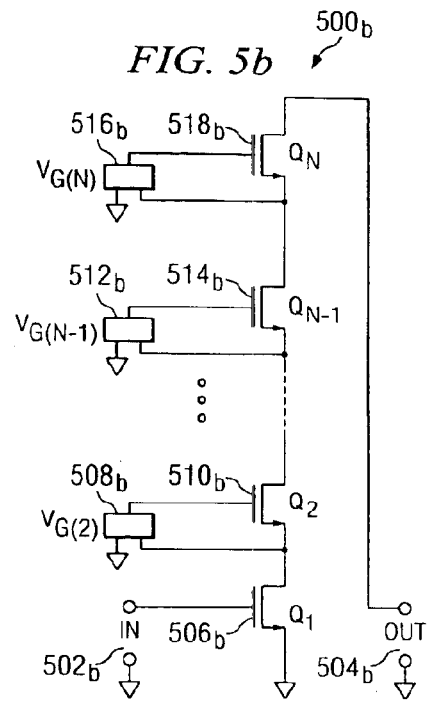

FIGS. 5a and 5b show cascode circuits 500a and 500b, respectively, with drain or source controlled gate voltages in accordance with an exemplary embodiment of the present invention. Cascode circuits 500a and 500b use a drain voltage or a source voltage to drive the gate voltage in order to keep drain-gate or collector-base and gate-source or base-emitter voltages below respective breakdown voltages.

FIG. 5a shows input 502a and output 504a with signal transistor 506a, which is connected in series with transistors 510a, 514a, and 518a which correspond to transistors $Q_2$, $Q_{N-1}$, and $Q_N$. Likewise, gate voltage sources 508a, 512a, and 516a correspond to $V_{G(2)}$, $V_{G(N-1)}$, and $V_{G(N)}$. These gate voltage sources are connected between the gate and the drain, so as to provide a gate voltage source that maintains a predetermined voltage distribution across each transistor. Cascode circuit 500b shows a similar configuration with the voltage source connected between the gate and the source. The gate voltage sources use a linear or nonlinear circuit that is coupled to either the associated transistor drain, the associated transistor source, or a suitable combination of both to drive the gate voltage for transistors $Q_2$ to $Q_N$, so as to keep the drain-gate or collector-base and gate-source or base-emitter voltages below the respective breakdown voltages. FIG. 5A shows a block diagram of this topology using the drain voltage to drive the gate, and FIG. 5B shows a block diagram of this topology using the source voltage to drive the gate. A similar configuration can also be implemented using BJT transistors.

FIG. 4 also shows the gate and drain voltages for an exemplary implementation of cascode circuit 500b with five MOSFET transistors. A similar circuit can be implemented with BJTs or other suitable devices, and with more or less devices as suitable. Using this technique, the voltage levels between the gate-source and drain-gate are controlled to prevent voltage levels that could result in breakdown from being applied to the transistors, even when the magnitude of the voltage at any given drain or source relative to common is larger than these gate breakdown voltages. Likewise, the gate driving circuit can be implemented in a manner that is simpler than if an independent linear or non-linear voltage circuit is provided, as it can use the source and drain voltages of respective transistors. This configuration is similar to the ideal gate driving voltage waveforms that satisfies the condition above to generate the gate driving signal.

Figure 6A:
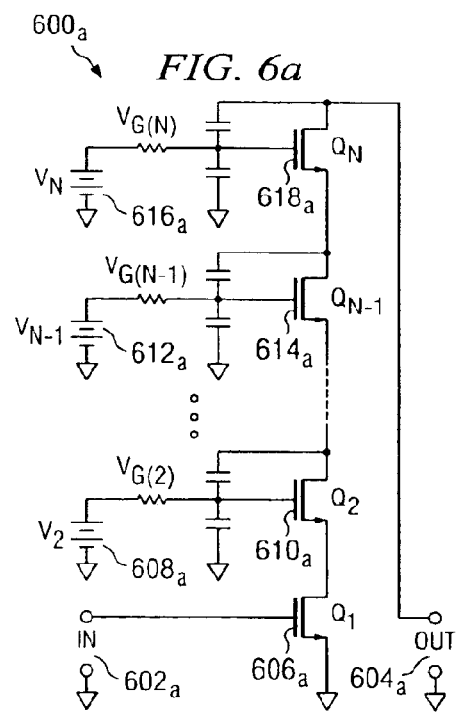
FIGS. 6a and 6b show cascode circuits with capacitive coupling to the drain or source in accordance with an exemplary embodiment of the present invention.
Figure 6B:
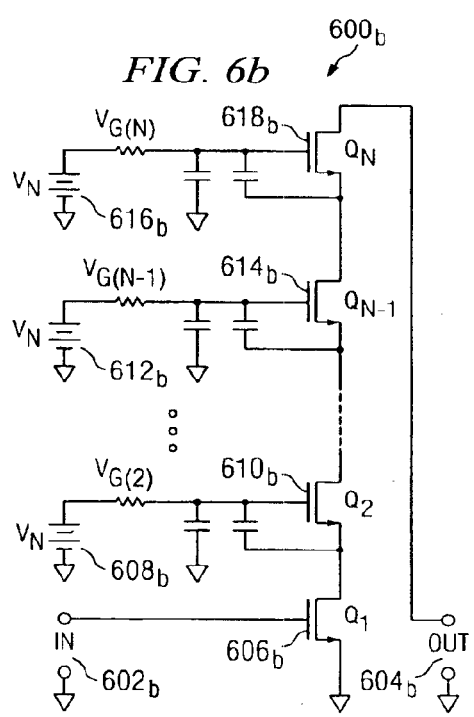

FIGS. 6a and 6b show cascode circuits 600a and 600b, respectively, with capacitive coupling to the drain and source in accordance with an exemplary embodiment of the present invention. Voltage sources 608a, 612a and 616a, and 608b, 612b, and 616b, each include a capacitive divider circuit which uses either the transistor drain voltage, the transistor source voltage, or a suitable combination of both to drive the gate voltage for transistors $Q_2$ to $Q_N$, so as to maintain the drain-gate voltage and the gate-source voltage at levels that are below the respective breakdown voltage. Cascode circuits 600a and 600b can also be implemented with BJTs or other suitable devices. Other suitable circuits can also or alternatively be used to provide drain-gate or gate-source coupling for multiple cascade configurations, such as resistor circuits, inductor circuits, resistor-capacitor circuits, resistor-inductor circuits, capacitor-inductor circuits, or resistor-capacitor-inductor circuits.

FIG. 4 also shows the gate and drain voltage waveforms for an exemplary circuit with five MOSFET transistors. A similar circuit can be implemented with BJTs or other suitable devices, and with more or less devices as suitable. Using this technique, the voltage levels between the gate-source and drain-gate are controlled to prevent voltage levels that could result in breakdown from being applied to the transistors, even when the magnitude of the voltage at any given drain or source relative to common is larger than these gate breakdown voltages.

Figure 7A:
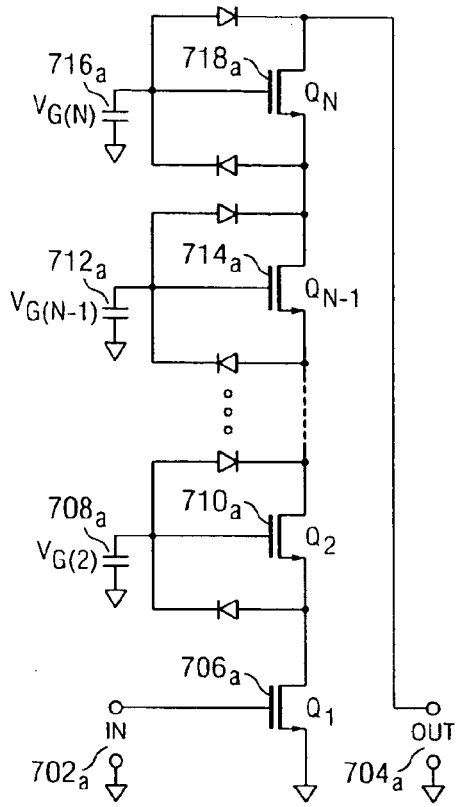
FIGS. 7A and 7B are cascode circuits with diode coupling to the drain and source in accordance with an exemplary embodiment of the present invention.
Figure 7B:
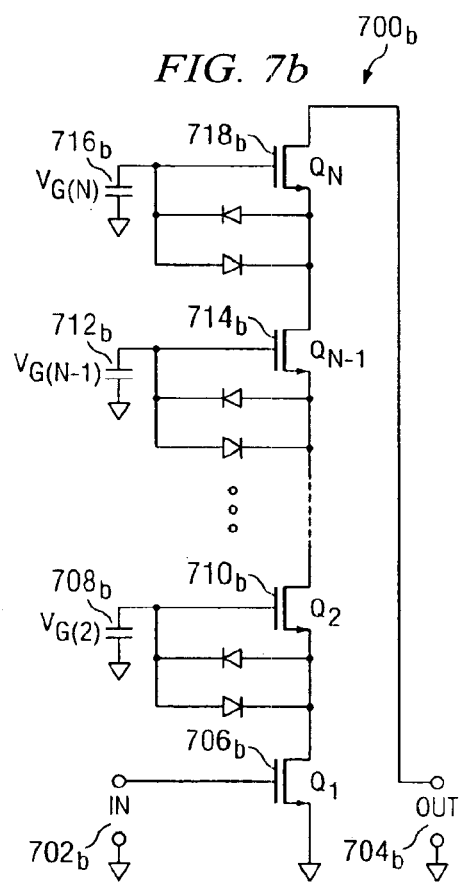

FIGS. 7A and 7B are cascode circuits 700a and 700b, respectively with diode coupling between the gate and the drain and source, in accordance with an exemplary embodiment of the present invention. Gate voltage sources 708a and 708b through 716a and 716b use a pair of diodes, transistors operating as diodes, or other suitable devices, with either the transistor drain voltage, the transistor source voltage, or both for each respective transistor $Q_2$ to $Q_N$ to drive the gate voltages for each transistor, so as to control the drain-gate voltage and gate-source voltage of each transistor to a level that is below the breakdown voltage. FIG. 7A shows a circuit diagram of this topology using drain- and source-derived voltage sources to drive the gate, and FIG. 7B shows a circuit diagram of this topology using the source-derived voltage sources to drive the gate. Cascode circuits 700a and 700b can also be implemented using BJTs or other suitable devices.

Figure 8:
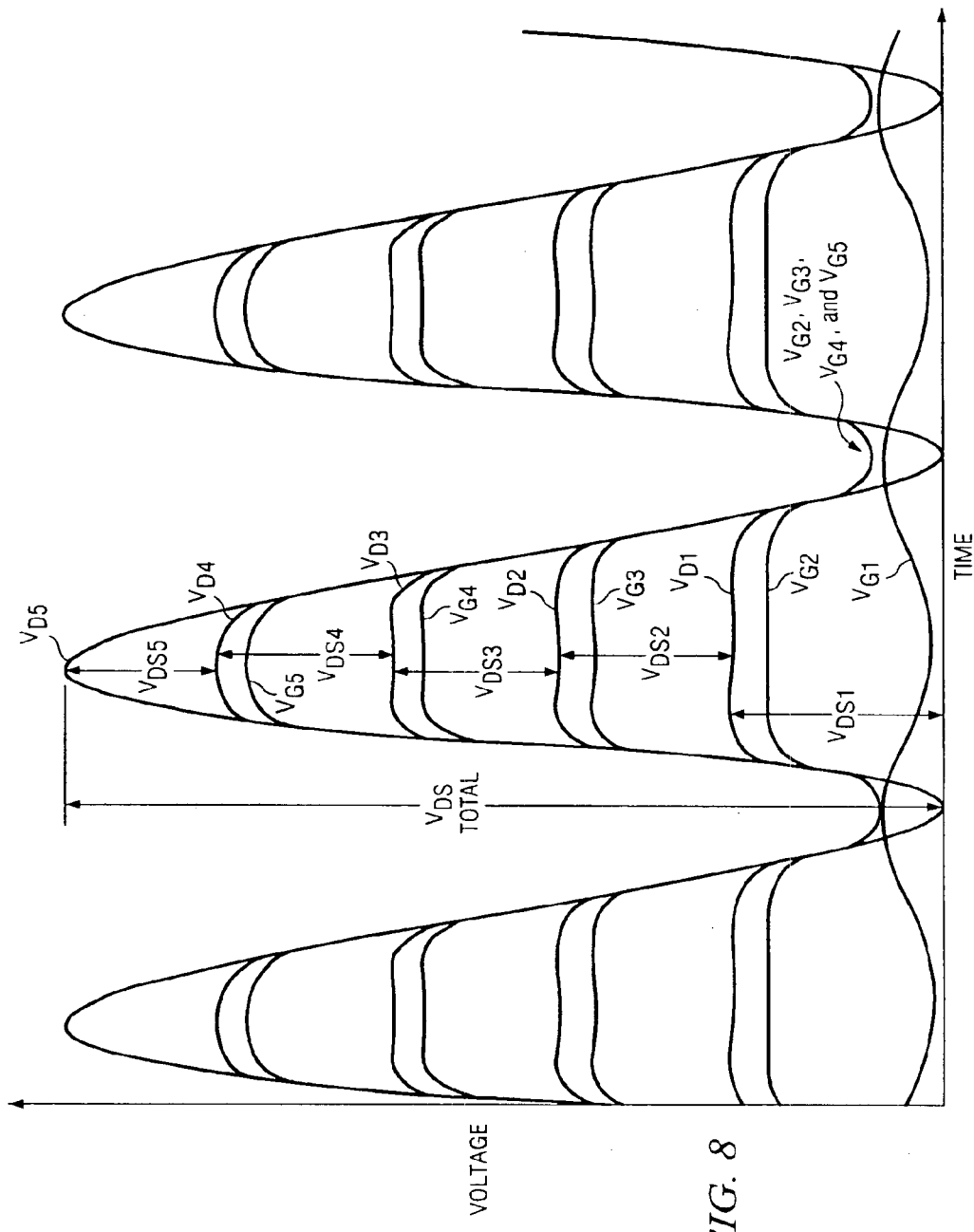
FIG. 8 shows the gate and drain voltage waveform for an exemplary circuit with five MOSFET transistors.

FIG. 8 shows the gate and drain voltage waveform for an exemplary implementation of cascode circuits 700a and 700b that uses five MOSFET transistors. The relationship of the voltage levels of $V_{DS1}$, $V_{DS2}$, $V_{DS3}$, $V_{DS4}$, and $V_{DS5}$; $V_{G2}$, $V_{G3}$, $V_{G4}$ and $V_{G5}$; and $V_{D1}$, $V_{D2}$, $V_{D3}$, and $V_{D4}$, respectively, is similar to that shown in FIG. 4, except that the $V_{G2}$, $V_{G3}$, $V_{G4}$ and $V_{G5}$ voltages are less than $V_{D1}$, $V_{D2}$, $V_{D3}$, and $V_{D4}$, respectively. A similar circuit can be implemented with BJTs or other suitable devices, and with more or less devices as suitable. Using this technique, the voltage levels between the gate-source and drain-gate are controlled to prevent voltage levels that could result in breakdown from being applied to the transistors, even when the magnitude of the voltage at any given drain or source relative to common is larger than these gate breakdown voltages.

Figure 9:
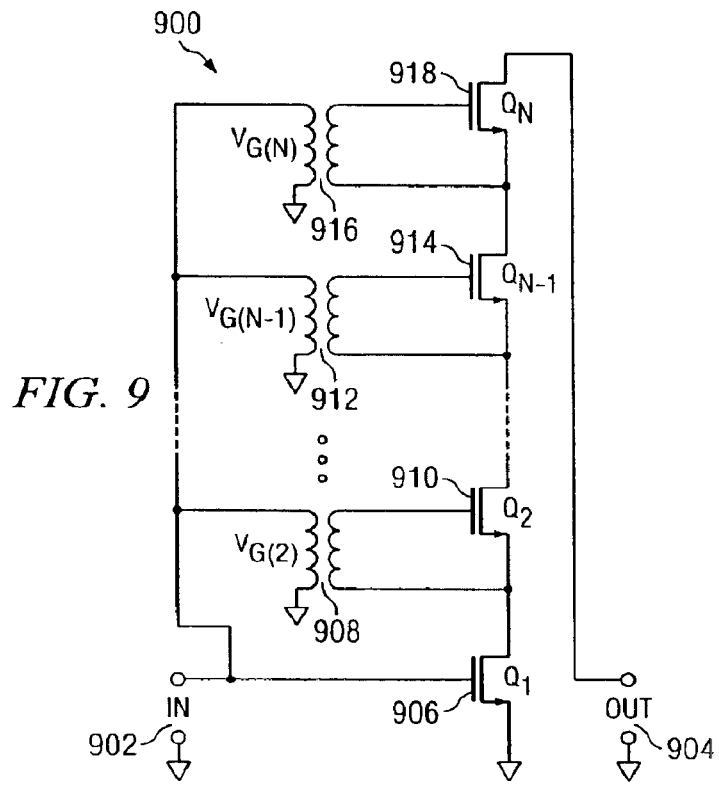
FIG. 9 is a cascode circuit with magnetic gate coupling in accordance with an exemplary embodiment of the present invention.

FIG. 9 is a cascode circuit 900 with magnetic gate coupling in accordance with an exemplary embodiment of the present invention. Cascode circuit 900 uses transformers that magnetically couple the input voltage signal to the secondary connected between gate and source to drive the gate voltage for transistors $Q_2$ to $Q_N$, keeping the drain-gate and gate-source voltages below the respective breakdown voltages. Cascode circuit 900 can also be implemented using BJTs or other suitable devices.

Figure 10:
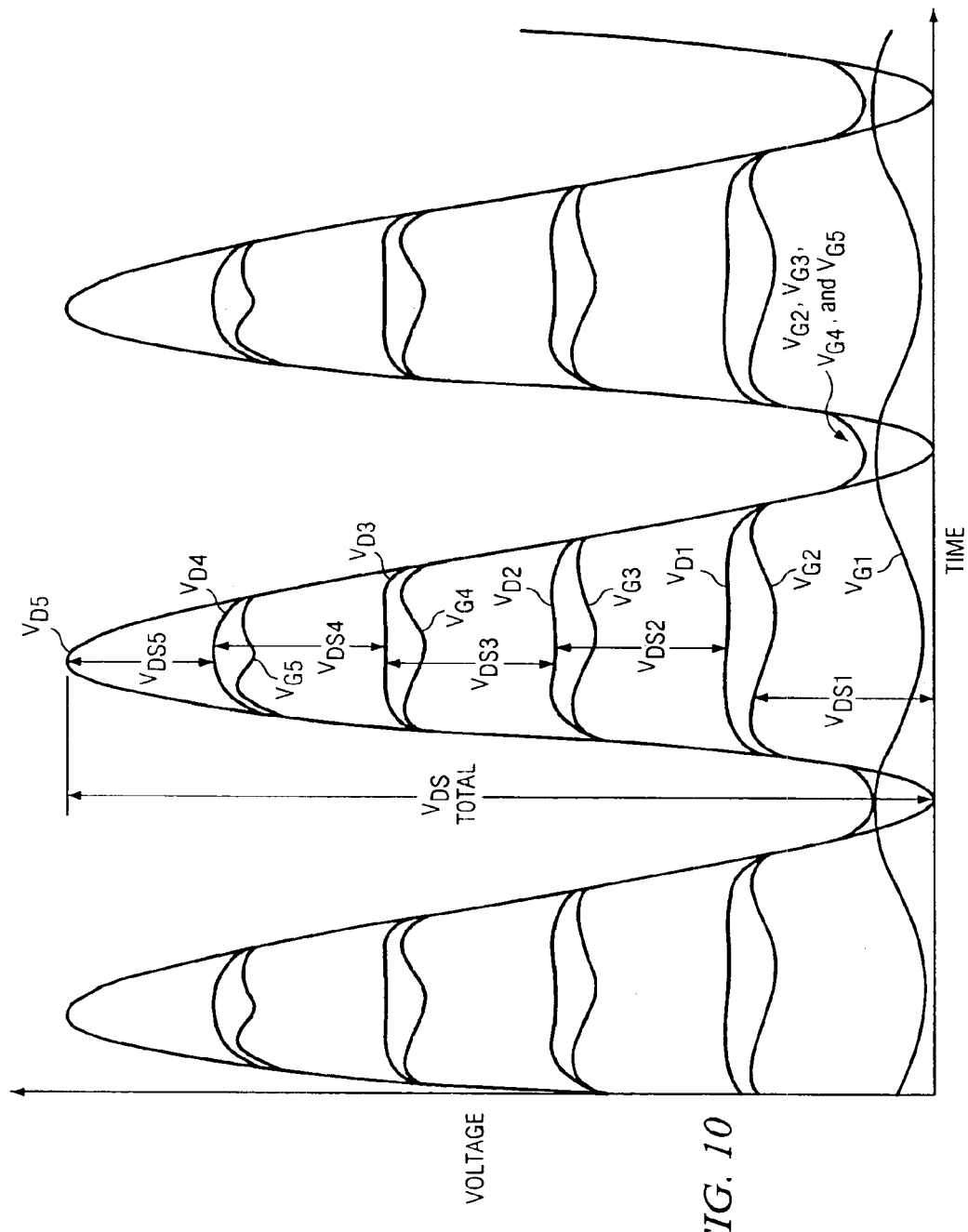
FIG. 10 shows the corresponding gate and drain voltage waveform for an exemplary circuit with five MOSFET transistors.

FIG. 10 shows the corresponding gate and drain voltage waveform for an exemplary implementation of cascode circuit 900 with five MOSFET transistors. The relationship of the voltage levels of $V_{DS1}$, $V_{DS2}$, $V_{DS3}$, $V_{DS4}$, and $V_{DS5}$; $V_{G2}$, $V_{G3}$, $V_{G4}$ and $V_{G5}$; and $V_{D1}$, $V_{D2}$, $V_{D3}$, and $V_{D4}$, respectively, is similar to that shown in FIG. 4, except that the $V_{G2}$, $V_{G3}$, $V_{G4}$ and $V_{G5}$ voltages are less than $V_{D1}$, $V_{D2}$, $V_{D3}$, and $V_{D4}$ and vary more over time due to the relationship between magnetic flux linkage changes and voltage levels. A similar circuit can be implemented with BJTs or other suitable devices, and with more or less devices as suitable. Using this technique, the voltage levels between the gate-source and drain-gate are controlled to prevent voltage levels that could result in breakdown from being applied to the transistors, even when the magnitude of the voltage at any given drain or source relative to common is larger than these gate breakdown voltages.

Figure 11:
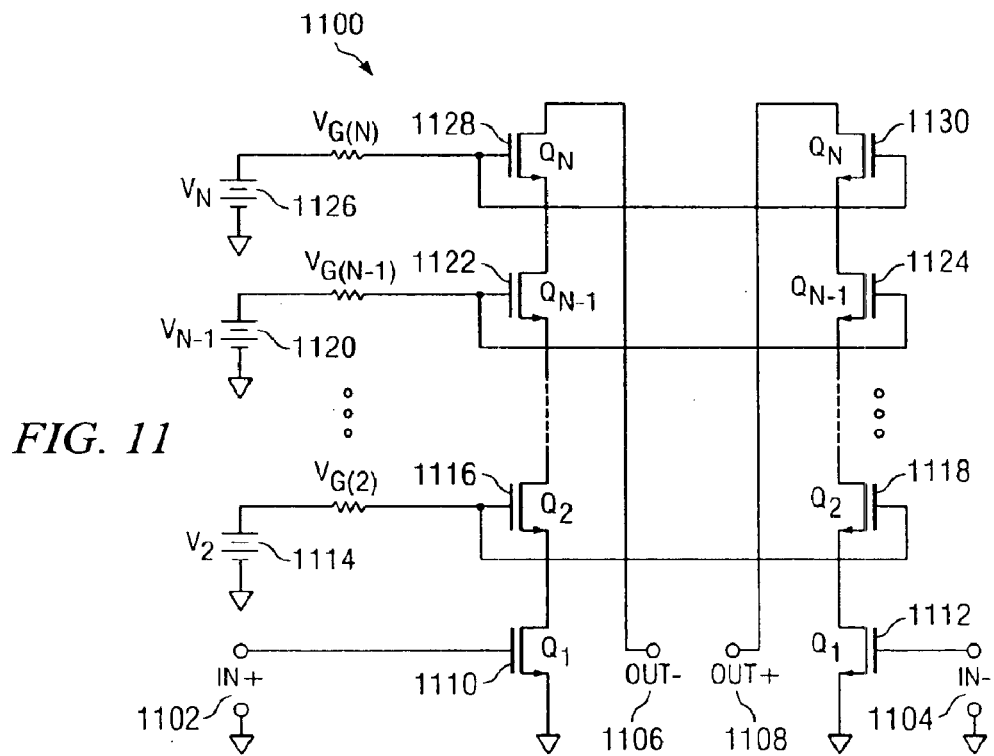
FIG. 11 is a differential cascode circuit in accordance with an exemplary embodiment of the present invention.

FIG. 11 is a differential cascode circuit 1100 in accordance with an exemplary embodiment of the present invention. Cascode circuit 1100 includes inputs 1102 and 1104, outputs 1106 and 1108, and signal transistors 1110 and 1112. Transistors 1116, 1122, and 1128 are matched to transistors 1118, 1124, and 1130, respectively, and each matched pair corresponds to transistors $Q_2$, $Q_{N-1}$, and $Q_N$. Likewise, gate voltage supply $V_{G(2)}$, $V_{G(N-1)}$, and $V_{G(N)}$ correspond to sources 1114, 1120, and 1126. Connections are provided between two adjacent gates of the matched transistors through a low impedance path to provide a differential structure resulting in conventional or multi-cascode transistors. DC voltage to these nodes is provided through a high impedance resistor connected to DC voltage sources. Other suitable voltage sources can also or alternatively be used, and the circuit can be implemented using BJTs or other suitable devices. Operation of cascode circuit 1100 implemented with five MOSFET pairs results in the gate and drain voltage waveforms shown in FIG. 4. This technique can also be used in conjunction with other suitable circuits including those disclosed herein to provide a virtual AC ground connection to the gate or base driving circuit.

The low impedance DC bias voltage can be provided to each one of the gates of the multi-cascode transistors without the use of bypass capacitors having large values connected to a low impedance ground. The elimination of these bypass capacitors and of the low impedance ground facilitates the layout, which significantly reduces the total area of the circuit, allows the circuit to be used for high power applications, and allows the circuit to be fabricated by integrated circuit processes that do not require ground via connections, such as conventional Si processes or SOI processes.

In one exemplary embodiment, instead of simply connecting the gates of the transistors together to form a differential amplifier as shown, the transistor gates of the adjacent distinct differential amplifiers can be connected together. This node becomes a virtual ground for all oddharmonic signals and in a similar way as described in relation to FIG. 11 above, the bypass capacitors from the gates or bases to ground can be eliminated. The advantages obtained are similar to that of cascode circuit 1100 and this modification allows an easier layout of the amplifier.

Although exemplary embodiments of the system and method of the present invention has been described in detail herein, those skilled in the art will also recognize that various substitutions and modifications can be made to the systems and methods without departing from the scope and spirit of the appended claims.

What is claimed is:

1. A cascode power circuit for providing improved withstand voltage for radio frequency switching transistors comprising:

three or more transistors, each having a control terminal and two conduction terminals, wherein the conduction terminals are coupled in series between two output terminals;

a radio frequency signal input coupled to the control terminal for the first transistor: and two or more control voltage sources, each coupled to a corresponding control terminal for the remaining transistors, the control voltage sources maintaining the voltage across each corresponding transistor to a level below a breakdown voltage level;

wherein a voltage drop across the three or more transistors exceeds a withstand voltage of any one of the three or more transistors, and wherein the control voltage sources are magnetically coupled to the signal input.

2. The cascode circuit of claim 1 wherein the control voltage sources are linear circuits.

3. The cascode circuit of claim 1 wherein the control voltage sources are non-linear circuits.

4. The cascode circuit of claim 1 wherein each control voltage source is coupled to one or more of the conduction terminals for the associated transistor.

5. The cascode circuit of claim 1 wherein the control voltage sources are capacitively coupled to one or more of the conduction terminals for the associated transistor.

6. The cascode circuit of claim 1 wherein the control voltage sources are resistively coupled to one or more of the conduction terminals for the associated transistor.

7. The cascode circuit of claim 1 wherein the control voltage sources are coupled to one or more of the conduction terminals for the associated transistor by diode drivers.

8. The cascode circuit of claim 1 further comprising a second cascode circuit having the same number of transistors, wherein the first cascode circuit and the second cascode circuit are coupled to form a differential cascode circuit.

9. A cascode circuit for providing improved withstand voltage for radio frequency switching transistors comprising:

two or more transistors, each having a control terminal and two conduction terminals, wherein the conduction terminals are coupled in series between two output terminals;

a radio-frequency signal input coupled to the control terminal for the first transistor, and one or more control voltage circuits, each coupled to a corresponding control terminal and to one or more of the conduction terminals for the remaining transistors, the control voltage circuits maintaining the voltage across each corresponding transistor to a level below a breakdown voltage level;

wherein a peak voltage across the three or more transistors exceeds a withstand voltage of anyone of the three or more transistors, and wherein the control voltage sources are magnetically coupled to the signal input.

10. The cascode circuit of claim 9 wherein the control voltage circuits are circuits.

11. The cascode circuit of claim 9 wherein the control voltage sources are non-linear circuits.

12. The cascode circuit of claim 9 wherein the control voltage sources are capacitively coupled to one or more of the conduction terminals for the associated transistor.

13. The cascode circuit of claim 9 wherein the control voltage sources are resistively coupled to one or more of the conduction terminals for the associated transistor.

14. The cascode circuit of claim 9 wherein the control voltage sources are coupled to one or more of the conduction terminals for the associated transistor by diode drivers.

15. The cascode circuit of claim 9 further comprising a second cascode circuit having the same number of transistors, wherein the first cascode circuit and the second cascode circuit are coupled to form a differential cascode circuit.

16. A method for providing increased withstand voltage capability for radio frequency switching transistors comprising:

connecting three or more transistors in series between two output terminals;

providing a radio frequency input signal to control input of one of the transistors;

providing a control voltage to the control input of each of the remaining transistors so as to maintain the voltage across each of the transistors to a level below a breakdown voltage;

wherein a peak voltage across the three or more transistors exceeds an operating voltage of any one of the three or more transistors; and wherein the control voltage sources are magnetically coupled to the radio frequency input signal.

17. The method of claim 16 wherein providing the control voltage to the control input of each of the remaining transistors comprises providing a DC bias voltage.

18. The method of claim 16 wherein providing the control voltage to the control input of each of the remaining transistors comprises deriving a voltage from a conduction terminal of each corresponding transistor.

* * * * *

UNITED STATES PATENT AND TRADEMARK OFFICE
CERTIFICATE OF CORRECTION

PATENT NO. : 6,888,396 B2
DATED : May 3, 2005
INVENTOR(S) : Hajimiri et al.

It is certified that error appears in the above-identified patent and that said Letters Patent is hereby corrected as shown below:

Column 8,
Line 2, change "transistor," to -- transistor; --.
Line 15, change "voltage circuits are circuits." to -- voltage circuits are linear circuits. --.

Signed and Sealed this

Fourth Day of October, 2005

JON W. DUDAS
*Director of the United States Patent and Trademark Office*

UNITED STATES PATENT AND TRADEMARK OFFICE
CERTIFICATE OF CORRECTION

PATENT NO.     : 6,888,396 B2
DATED          : May 3, 2005
INVENTOR(S)    : Hajimiri et al.

It is certified that error appears in the above-identified patent and that said Letters Patent is hereby corrected as shown below:

<u>Title page,</u>
Item [75], Inventors, change "Ichiri Aoki" to -- Ichiro Aoki --.

Signed and Sealed this

Fifteenth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,888,396 B2
DATED : May 3, 2005
INVENTOR(S) : Seyed-Ali Hajimiri et al.

It is certified that error appears in the above-identified patent and that said Letters Patent is hereby corrected as shown below:

<u>Title page,</u>
Insert Item
-- [73] Assignee: California Institute of Technology, Pasadena, California --.

Signed and Sealed this

Thirty-first Day of January, 2006

JON W. DUDAS
*Director of the United States Patent and Trademark Office*